US011996723B2

(12) United States Patent
Zhou

(10) Patent No.: US 11,996,723 B2
(45) Date of Patent: May 28, 2024

(54) DRIVING CIRCUIT FOR SWITCH AND BATTERY CONTROL CIRCUIT USING THE SAME

(71) Applicant: Dongguan NVT Technology Limited, Dongguan (CN)

(72) Inventor: Jun Zhou, Dongguan (CN)

(73) Assignee: DONGGUAN NVT TECHNOLOGY LIMITED, Dongguan (CN)

( * ) Notice: Subject to any disclaimer, the term of this patent is extended or adjusted under 35 U.S.C. 154(b) by 440 days.

(21) Appl. No.: 16/648,271

(22) PCT Filed: Mar. 5, 2020

(86) PCT No.: PCT/CN2020/078067
§ 371 (c)(1),
(2) Date: May 18, 2021

(87) PCT Pub. No.: WO2020/187051
PCT Pub. Date: Sep. 24, 2020

(65) Prior Publication Data
US 2021/0273470 A1    Sep. 2, 2021

(30) Foreign Application Priority Data
Mar. 21, 2019 (CN) .......................... 201910219362.2

(51) Int. Cl.
*H02J 7/00* (2006.01)
*H03K 17/00* (2006.01)
(Continued)

(52) U.S. Cl.
CPC .......... *H02J 7/0068* (2013.01); *H02J 7/0029* (2013.01); *H03K 17/04206* (2013.01); *H03K 17/687* (2013.01)

(58) Field of Classification Search
CPC .................. H02J 7/0068; H02J 7/0029; H03K 17/04206; H03K 17/587; H03K 17/687
(Continued)

(56) References Cited

U.S. PATENT DOCUMENTS 5,508,874 A * 4/1996 Williams ............. H03K 17/302
361/33
6,008,680 A * 12/1999 Kyles ..................... H03K 5/131
327/284
(Continued)

FOREIGN PATENT DOCUMENTS

CN    103916114 A    7/2014
CN    206023570 U    3/2017
(Continued)

OTHER PUBLICATIONS

Lu, Chinese Patent Document No. CN-207354057-U, published May 11, 2018, with annotated machine translation, 24 pages. (Year: 2018).*
(Continued)

*Primary Examiner* — Phallaka Kik
(74) *Attorney, Agent, or Firm* — Ladas & Parry LLP

(57) ABSTRACT

The present disclosure provides a switch driving circuit, the switch driving circuit includes a discharge circuit, a switch driving port, a voltage generating circuit, and a port conduction circuit. The discharge circuit supplies a voltage to the voltage generating circuit. The voltage generating circuit boosts the voltage to a driving voltage according to signal outputted by a microcontroller. The driving voltage controls an electronic switch module connected to the switch driving port to turn on or turn off. The port conduction circuit controls the switch driving port to make a connection between the voltage generating circuit and the electronic switch module according to a first control signal of the microcontroller. The present disclosure also provides a bat-
(Continued)

tery controlling circuit. The switch driving circuit and battery controlling circuit provided according to the embodiments of the present disclosure have functions safety requirements, strong scalability, low cost, and the drive voltage and drive capacity can be flexibly adjusted.

14 Claims, 4 Drawing Sheets

(51) Int. Cl.
*H03K 17/042* (2006.01)
*H03K 17/687* (2006.01)

(58) Field of Classification Search
USPC ............... 320/127, 128, 134, 135, 136, 140
See application file for complete search history.

(56) References Cited

U.S. PATENT DOCUMENTS

| | | | |
|---|---|---|---|
| 6,031,778 A * | 2/2000 | Makino | G11C 7/065 365/189.11 |
| 7,595,608 B2 | 9/2009 | Gangstoe et al. | |
| 7,679,321 B2 | 3/2010 | Takeshita | |
| 7,834,657 B1 * | 11/2010 | Arora | H03K 19/00384 327/80 |
| 9,660,511 B2 | 5/2017 | Morimoto | |
| 9,673,622 B2 * | 6/2017 | Wang | G06F 1/305 |
| 9,912,329 B2 | 3/2018 | Fukami | |
| 2006/0066379 A1 * | 3/2006 | Hopsecger | H03K 17/063 327/306 |
| 2008/0068768 A1 * | 3/2008 | Wu | H02J 7/007182 361/38 |
| 2008/0088184 A1 * | 4/2008 | Tung | H02J 1/08 307/80 |
| 2010/0026257 A1 * | 2/2010 | Huang | H02M 3/158 323/282 |
| 2011/0109376 A1 | 5/2011 | Li | |
| 2012/0293219 A1 * | 11/2012 | Bai | H02M 3/1588 327/109 |
| 2013/0026833 A1 * | 1/2013 | Huang | H02J 9/06 307/48 |
| 2014/0111215 A1 * | 4/2014 | Inukai | H03K 5/24 327/83 |
| 2014/0306673 A1 * | 10/2014 | Le | H02J 7/00 323/266 |
| 2016/0218612 A1 | 7/2016 | Morimoto | |
| 2017/0063152 A1 * | 3/2017 | Hinterberger | H02J 3/32 |
| 2018/0019661 A1 * | 1/2018 | Gao | G06F 1/26 |
| 2018/0138691 A1 * | 5/2018 | Duan | H02H 3/18 |
| 2018/0323624 A1 * | 11/2018 | Chang | H02J 7/06 |

FOREIGN PATENT DOCUMENTS

| | | | | |
|---|---|---|---|---|
| CN | 207150798 U | 3/2018 | | |
| CN | 107891756 A | 4/2018 | | |
| CN | 207354057 U | 5/2018 | | |
| CN | 109302050 A | 2/2019 | | |
| JP | 2012135197 A | * | 7/2012 | ............ H02M 3/073 |
| JP | 2015171305 A | | 9/2015 | |
| JP | 2017169412 A | | 9/2017 | |

OTHER PUBLICATIONS

European Search Report (EESR) for copending application EP 20709463.2 dated Feb. 24, 2023.
Maxim Ic: High-Side, n-Channel MOSFET Switch Driver: Dec. 31, 2015: pp. 1-9.

* cited by examiner

DRIVING CIRCUIT FOR SWITCH AND BATTERY CONTROL CIRCUIT USING THE SAME

FIELD

The subject matter herein generally relates to battery switching, in particular, to a switch driving circuit and a battery controlling circuit.

BACKGROUND

With the rapid development of consumer electronic products, in order to ensure the safe use of consumer electronic products. The battery used in electronic products is usually equipped with a battery management system (BMS).

In the existing technology, the BMS uses an NMOS (N-Metal-Oxide-Semiconductor) as a positive-terminal main switch, or uses a driving module with an isolated power supply. However, the switch-driving capability is restricted by the internal circuit of the switching chip, which is inconvenient to expand or can be high in cost.

SUMMARY

What is needed, is a switch driving circuit and a battery controlling circuit. The circuit is highly expandable, the cost is low, and the drive voltage and drive capability can be flexibly adjusted.

An embodiment of the present disclosure provides a switch driving circuit. The switch driving circuit includes: a switch driving port, a discharge circuit, a voltage generating circuit, and a port conduction circuit, the switch driving port is coupled to an electronic switch module, the discharge circuit outputs a supply voltage, the voltage generating circuit boosts the supply voltage to a driving voltage according to an output signal of a microcontroller; wherein the driving voltage is configured to turn the electronic switch module on or off, the port conduction circuit is coupled to the switch driving port, and the port conduction circuit controls the switch driving port to conduct a connection between the voltage generating circuit and the electronic switch module according to a first control signal of the microcontroller. According to some embodiments of the present disclosure, the switch driving circuit further comprises a port shutdown circuit, the port shutdown circuit is electrically coupled between the switch driving port and the microcontroller, and the port shutdown circuit control the switch driving port to disconnect the connection between the voltage generating circuit and the electronic switch module according to a second control signal of the microcontroller. According to some embodiments of the present disclosure, the switch driving circuit further comprises a voltage feedback circuit, the voltage feedback circuit is electrically coupled to the voltage generating circuit through the port conduction circuit, and the voltage feedback circuit detects the driving voltage and feeds back the driving voltage to the microcontroller. According to some embodiments of the present disclosure, the switch driving circuit further comprises a switch feedback circuit, the switch feedback circuit is electrically coupled to the electronic switch module, and the switch feedback circuit detects state of the electronic switch module. According to some embodiments of the present disclosure, the switch driving circuit further comprises a drive supply circuit, the drive supply circuit is electrically coupled to the voltage generating circuit, and the drive supply circuit supplies power to the voltage generating circuit. According to some embodiments of the present disclosure, the discharge circuit comprises a first electronic switch, a second electronic switch, a first resistor, a second resistor, a third resistor, and a fourth resistor; a first terminal of the first electronic switch is electrically coupled to a first control pin of the microcontroller through the first resistor, a second terminal of the first electronic switch is grounded, and a third terminal of the first electronic switch is electrically coupled to a first terminal of the second electronic switch through the second resistor: and wherein the first terminal of the second electronic switch is electrically coupled to a second terminal of the second electronic switch through the third resistor, a second terminal of the second electronic switch is electrically coupled to a battery positive electrode, and a third terminal of the second electronic switch is electrically coupled to the voltage generating circuit through the fourth resistor. According to some embodiments of the present disclosure, the voltage generating circuit comprises a third electronic switch, a fourth electronic switch, a first diode, a second diode, a third diode, a fourth diode, a first capacitor, a fifth resistor, a sixth resistor, and a seventh resistor; a first terminal of the third electronic switch is electrically coupled to a second control pin of the microcontroller through the fifth resistor, a second terminal of the third electronic switch is grounded, and a third terminal of the third electronic switch is electrically coupled to the drive supply circuit; a first terminal of the fourth electronic switch is electrically coupled to the second control pin of the microcontroller through the sixth resistor, a second terminal of the fourth electronic switch is grounded, and a third terminal of the fourth electronic switch is electrically coupled to a cathode of the first diode through the seventh resistor; an anode of the first diode is electrically coupled to a cathode of the second diode, an anode of the second diode is electrically coupled to the drive supply circuit, and the cathode of the second diode is electrically coupled to an anode of the third diode through the first capacitor; and a cathode of the third diode is electrically coupled to the port conduction circuit, the anode of the third diode is electrically coupled to a cathode of the fourth diode, and an anode of the fourth diode is electrically coupled to the third terminal of the second electronic switch through the fourth resistor. According to some embodiments of the present disclosure, the voltage generating circuit further comprises a second capacitor and a first zener diode; a first terminal of the second capacitor is electrically coupled to the cathode of the third diode, and a second terminal of the second capacitor is electrically coupled to the anode of the fourth diode; a cathode of the first zener diode is electrically coupled to the first terminal of the second capacitor, and an anode of the first zener diode is electrically coupled to the second terminal of the second capacitor. According to some embodiments of the present disclosure, the port conduction circuit comprises a fifth electronic switch, a sixth electronic switch, an eighth resistor, a ninth resistor, and a tenth resistor; a first terminal of the fifth electronic switch is electrically coupled to a third control pin of the microcontroller through the eighth resistor, a second terminal of the fifth electronic switch is grounded, and a third terminal of the fifth electronic switch is electrically coupled to a first terminal of the sixth electronic switch through the ninth resistor; the first terminal of the sixth electronic switch is electrically coupled to a second terminal of the sixth electronic switch through the tenth resistor, a second terminal of the sixth electronic switch is electrically coupled to the cathode of the third diode, a third terminal of the sixth electronic switch is electrically coupled to the switch driving port. According to some embodiments of the present disclosure, the port shutdown circuit comprises a seventh electronic switch, an eighth electronic switch, an eleventh resistor a twelfth resistor, and a thirteenth resistor; a first terminal of the seventh electronic switch is electrically coupled to a fourth control pin of the microcontroller through the eleventh resistor, a second terminal of the seventh electronic switch is grounded, and a third terminal of the seventh electronic switch is electrically coupled to a first terminal of the eighth electronic switch through the twelfth resistor; the first terminal of the eighth electronic switch is electrically coupled to a second terminal of the eighth electronic switch through the thirteenth resistor, the second terminal of the eighth electronic switch is electrically coupled to the third terminal of the sixth electronic switch, and a third terminal of the eighth electronic switch is electrically coupled to the anode of the fourth diode. According to some embodiments of the present disclosure, the voltage feedback circuit comprises a fourteenth resistor, a fifteenth resistor, a sixteenth resistor, and a third capacitor; a first terminal of the fourteenth resistor is electrically coupled to the fifth control pin of the microcontroller, the first terminal of the fourteenth resistor is grounded through the third capacitor, a second terminal of the fourteenth resistor is grounded through the fifteenth resistor, and the second terminal of the fourteenth resistor is electrically coupled to the cathode of the first zener diode through the sixteenth resistor. According to some embodiments of the present disclosure, the voltage feedback circuit comprises a fourteenth resistor, a fifteenth resistor, a sixteenth resistor, and a third capacitor; a first terminal of the fourteenth resistor is electrically coupled to the fifth control pin of the microcontroller, the first terminal of the fourteenth resistor is grounded through the third capacitor, a second terminal of the fourteenth resistor is grounded through the fifteenth resistor, and the second terminal of the fourteenth resistor is electrically coupled to the third terminal of the sixth electronic switch through the sixteenth resistor. According to some embodiments of the present disclosure, the switch feedback circuit comprises a seventeenth resistor, an eighteenth resistor, a nineteenth resistor, and a fourth capacitor; a first terminal of the seventeenth resistor is electrically coupled to a sixth control pin of the microcontroller, the first terminal of the seventeenth resistor is grounded through the fourth capacitor, a second terminal of the seventeenth resistor is electrically coupled to a node between the electronic switch module and an external port through the nineteenth resistor, and the second terminal of the seventeenth resistor is grounded through the eighteenth resistor. According to some embodiments of the present disclosure, the drive supply circuit comprises a ninth electronic switch, a tenth electronic switch, a twenty resistor, a twenty-first resistor, a twenty-second resistor, and a twenty-third resistor; a first terminal of the ninth electronic switch is electrically coupled to a seventh control pin of the microcontroller through the twenty resistor, a second terminal of the ninth electronic switch is grounded, the first terminal of the ninth electronic switch is electrically coupled to the second terminal of the ninth electronic switch through the twenty-first resistor, a third terminal of the ninth electronic switch is electrically coupled to a second terminal of the tenth electronic switch through the twenty-second resistor and the twenty-third resistor; a first terminal of the tenth electronic switch is electrically coupled to a node between the twenty-second resistor and the twenty-third resistor, the second terminal of the tenth electronic switch is electrically coupled to the battery positive electrode, a third terminal of the tenth electronic switch is electrically coupled to the anode of the second diode.

Another embodiment of the present disclosure provides a battery controlling circuit. The battery controlling circuit includes: a microcontroller, an electronic switch module, and a switch driving circuit, the electronic switch module is coupled between a battery positive electrode and an external port to form a circuit loop, and controls the circuit loop to be turned on or off; the microcontroller is coupled to the switch driving circuit, and outputs signal to the switch driving circuit; the switch driving circuit is coupled to the electronic switch module, and turns the electronic switch module on or off according to the signal of the microcontroller. According to some embodiments of the present disclosure, the electronic switch module comprises an eleventh electronic switch and a twelfth electronic switch; a first terminal of the eleventh electronic switch is electrically coupled to the switch driving port, a second terminal of the eleventh electronic switch is electrically coupled to the battery positive electrode, and a third terminal of the eleventh electronic switch is electrically coupled to the first terminal of the eleventh electronic switch through a twenty-fourth resistor; a first terminal of the twelfth electronic switch is electrically coupled to the switch driving port, a second terminal of the twelfth electronic switch is electrically coupled to the external port, a third terminal of the twelfth electronic switch is electrically coupled to the third terminal of the eleventh electronic switch, and the third terminal of the twelfth electronic switch is electrically coupled to the first terminal of the twelfth electronic switch through a first zener diode.

The switch drive circuit and the battery control circuit having the switch drive circuit provided by the embodiment of the present disclosure provide a power supply voltage to the voltage generating circuit through the discharge circuit, and generate a drive voltage through the voltage generating circuit, to control the electronic switch module connected to the switch drive port is turned on or off. The switch driving circuit and the battery controlling circuit are highly expandable, the cost is low, and the drive voltage and drive capability can be flexibly adjusted.

BRIEF DESCRIPTION OF THE DRAWINGS

Implementations of the present disclosure will now be described, by way of embodiments as below, with reference to the attached figures.

DETAILED DESCRIPTION

Figure 1:
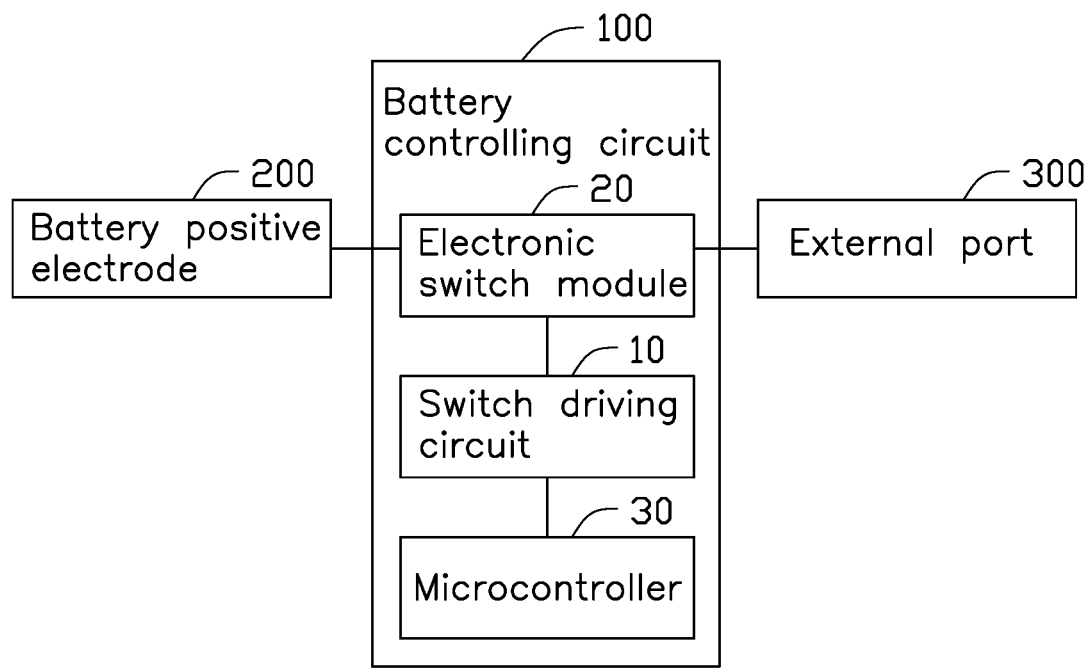
FIG. 1 is a schematic diagram of an embodiment of a battery controlling circuit.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

FIG. 1 illustrates a battery controlling circuit 100 in accordance with an embodiment of the present disclosure.

The battery controlling circuit 100 is electrically coupled between a battery positive electrode 200 and an external port 300 to form a circuit loop. The battery controlling circuit 100 controls the circuit loop to be turned on or turned off.

The battery controlling circuit 100 includes a switch driving circuit 10, an electronic switch module 20, and a microcontroller 30.

In at least one embodiment, the electronic switch module 20 is electrically coupled between the battery positive electrode 200 and an external port 300. The switch driving circuit 10 is electrically coupled between the electronic switch module 20 and the microcontroller 30.

The microcontroller 30 outputs a signal to the switch driving circuit 10, and the switch driving circuit 10 turns the electronic switch module 20 on or off.

Figure 2:
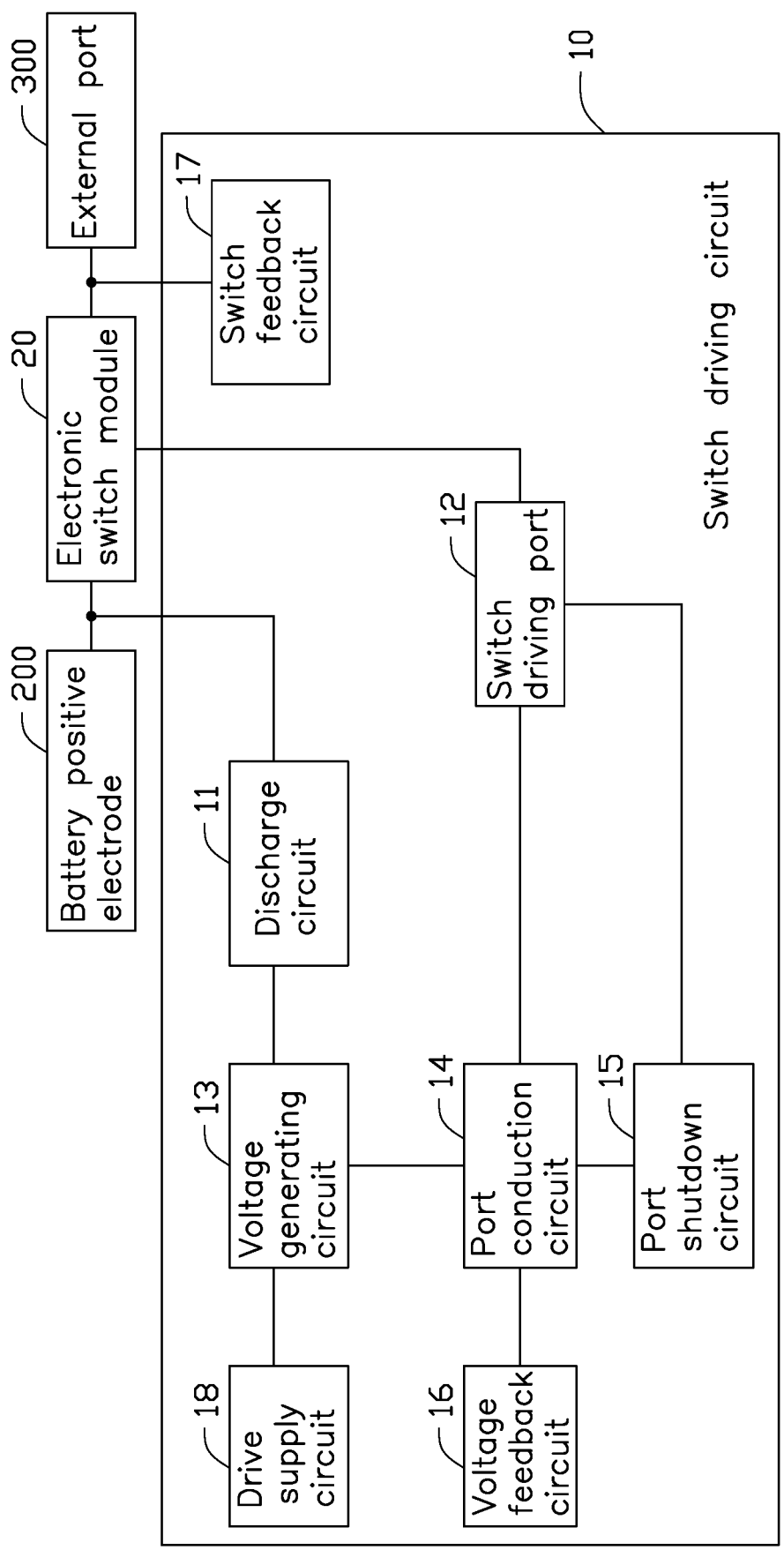
FIG. 2 is a schematic diagram of an embodiment of a switch driving circuit of the battery controlling circuit of FIG. 1.

FIG. 2 is a schematic diagram of an embodiment of the switch driving circuit 10.

In at least one embodiment, the switch driving circuit 10 includes a discharge circuit 11, a switch driving port 12, a voltage generating circuit 13, and a port conduction circuit 14.

The discharge circuit 11 is electrically coupled to and supplies a voltage to the voltage generating circuit 13.

The voltage generating circuit 13 is electrically coupled to the switch driving port 12 through the port conduction circuit 14. The voltage generating circuit 13 is configured to boost the voltage according to an output signal of the microcontroller 30, and output a driving voltage. The driving voltage is configured to turn the electronic switch module 20 connected to the switch driving port 12 on or off.

The port conduction circuit 14 is configured to control the switch driving port 12 to make the connection between the voltage generating circuit 13 and the electronic switch module 20 according to a first control signal outputted by the microcontroller 30.

In at least one embodiment, the switch driving circuit 10 further includes a port shutdown circuit 15, and the port shutdown circuit 15 is electrically coupled to the switch driving port 12. The port shutdown circuit 15 is configured to control the switch driving port 12 to break the connection between the voltage generating circuit 13 and the electronic switch module 20 according to a second control signal outputted by the microcontroller 30.

In at least one embodiment, the switch driving circuit 10 further includes a voltage feedback circuit 16, and the voltage feedback circuit 16 is electrically coupled to the voltage generating circuit 13 through the port conduction circuit 14. The voltage feedback circuit 16 detects the driving voltage, and feeds the driving voltage back to the microcontroller 30.

In at least one embodiment, the switch driving circuit 10 further includes a switch feedback circuit 17, and the switch feedback circuit 17 is electrically coupled to the electronic switch module 20. The switch feedback circuit 17 is configured to detect state of the electronic switch module 20 and feed the detected state back to the microcontroller 30 in real time.

In an embodiment, the switch driving circuit 10 further includes a drive supply circuit 18, and the drive supply circuit 18 is electrically coupled to the voltage generating circuit 13. The drive supply circuit 18 is configured to supply power to the voltage generating circuit 13.

Figure 3:
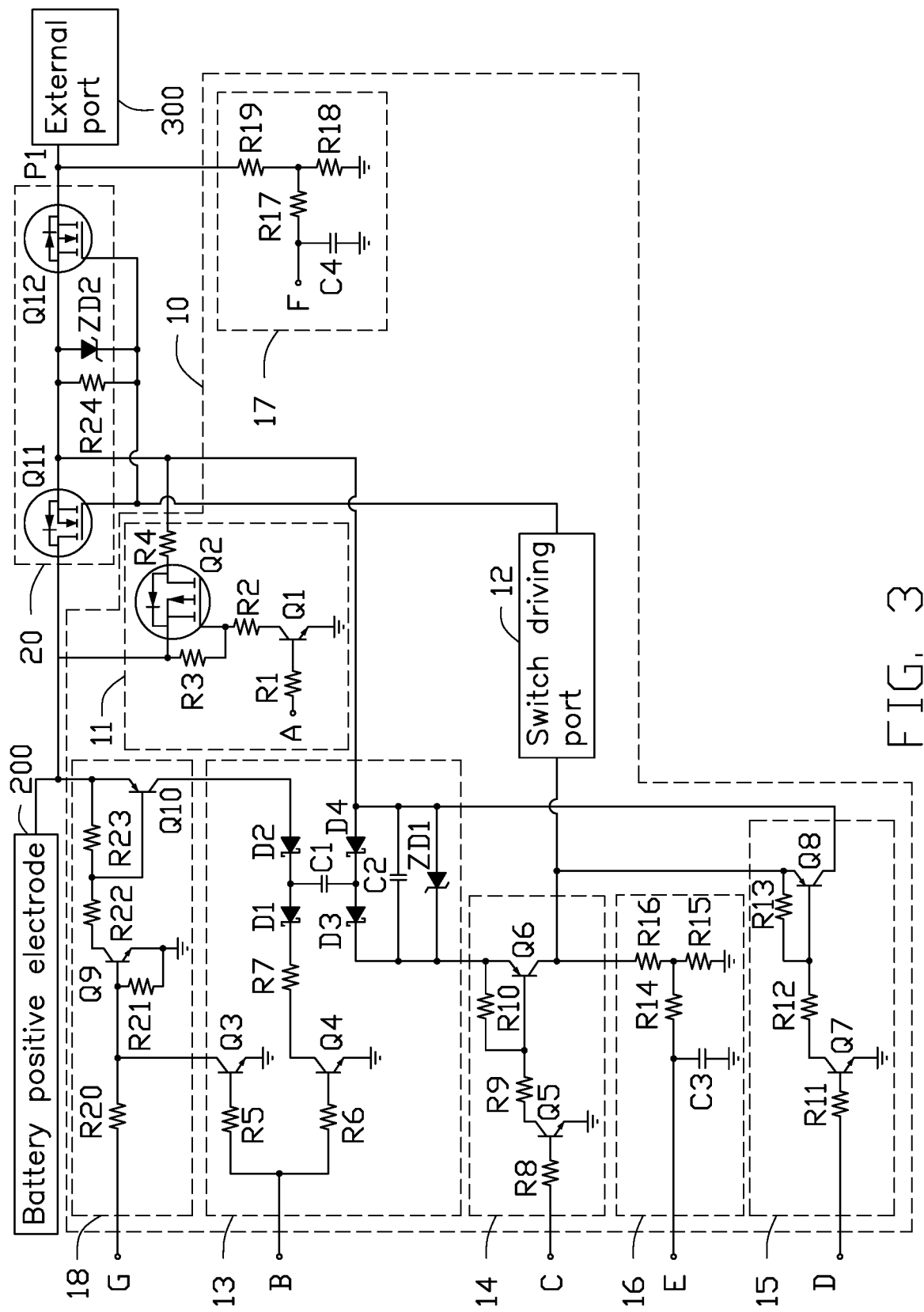
FIG. 3 is a circuit diagram of first embodiment of the battery controlling circuit of FIG. 1.

FIG. 3 illustrates a circuit diagram of the switch driving circuit 100 in accordance with a first embodiment of the present disclosure.

In at least one embodiment, the discharge circuit 11 includes a first electronic switch Q1, a second electronic switch Q2, a first resistor R1, a second resistor R2, a third resistor R3, and a fourth resistor R4.

A first terminal of the first electronic switch Q1 is electrically coupled to a first control pin A of the microcontroller 30 through the first resistor R1, a second terminal of the first electronic switch Q1 is grounded, and a third terminal of the first electronic switch Q1 is electrically coupled to a first terminal of the second electronic switch Q2 through the second resistor R2. The first terminal of the second electronic switch Q2 is electrically coupled to a second terminal of the second electronic switch Q2 through the third resistor R3, a second terminal of the second electronic switch Q2 is electrically coupled to the battery positive electrode 200, and a third terminal of the second electronic switch Q2 is electrically coupled to the voltage generating circuit 13 through the fourth resistor R4.

In one embodiment, the first electronic switch Q1 may be NPN type triode, and the second electronic switch Q2 may be P-type field effect transistor (P-FET). The first terminal of the first electronic switch Q1 may be a base of the NPN type triode, the second terminal of the first electronic switch Q1 may be an emitter of the NPN type triode, and the third terminal of the first electronic switch Q1 may be a collector of the NPN type triode. The first terminal of the second electronic switch Q2 may be a gate of the P-FET, the second terminal of the second electronic switch Q2 may be a source of the P-FET, and the third terminal of the second electronic switch Q2 may be a drain of the P-FET.

In at least one embodiment, the voltage generating, circuit 13 includes a third electronic switch Q3, a fourth electronic switch Q4, a first diode D1, a second diode D2, a third diode D3, a fourth diode D4, a first capacitor C1, a fifth resistor R5, a sixth resistor R6, and a seventh resistor R7.

A first terminal of the third electronic switch Q3 is electrically coupled to a second control pin B of the microcontroller 30 through the fifth resistor R5, a second terminal of the third electronic switch Q3 is grounded, and a third terminal of the third electronic switch Q3 is electrically coupled to the drive supply circuit 18.

A first terminal of the fourth electronic switch Q4 is electrically coupled to the second control pin B of the microcontroller 30 through the sixth resistor R6, a second terminal of the fourth electronic switch Q4 is grounded, and a third terminal of the fourth electronic switch Q4 is electrically coupled to a cathode of the first diode D1 through the resistor R7.

An anode of the first diode D1 is electrically coupled to a cathode of the diode D2, an anode of the second diode D2 is electrically coupled to the drive supply circuit 18, and the cathode of the second diode D2 is electrically coupled to an anode of the third diode D3 through the first capacitor C1.

A cathode of the third diode D3 is electrically coupled to the port conduction circuit 14, the anode of the third diode D3 is electrically coupled to a cathode of the fourth diode D4, and an anode of the fourth diode D4 is electrically coupled to the third terminal of the second electronic switch Q2 through the fourth resistor R4.

In one embodiment, the third electronic switch Q3 and the fourth electronic switch Q4 may be NPN type triode. The first terminal of the third electronic switch Q3 and the fourth electronic switch Q4 may be a base of the NPN type triode, the second terminal of the third electronic switch Q3 and the fourth electronic switch Q4 may be an emitter of the NPN type triode, and the third terminal of the third electronic switch Q3 and the fourth electronic switch Q4 may be a collector of the NPN type triode.

In at least one embodiment, the voltage generating circuit 13 further includes a second capacitor C2 and a first zener diode ZD1.

A first terminal of the second capacitor C2 is electrically coupled to the cathode of the third diode D3, and a second terminal of the second capacitor C2 is electrically coupled to the anode of the fourth diode D4. A cathode of the first zener diode ZD1 is electrically coupled to the first terminal of the second capacitor C2, and an anode of the first zener diode ZD1 is electrically coupled to the second terminal of the second capacitor C2.

In at least one embodiment, the port conduction circuit 14 includes a fifth electronic switch Q5, a sixth electronic switch Q6, an eighth resistor R8, a ninth resistor R9, and a tenth resistor R10.

A first terminal of the fifth electronic switch Q5 is electrically coupled to a third control pin C of the microcontroller 30 through the eighth resistor R8, a second terminal of the fifth electronic switch Q5 is grounded, and a third terminal of the fifth electronic switch Q5 is electrically coupled to a first terminal of the sixth electronic switch Q6 through the ninth resistor R9. The first terminal of the sixth electronic switch Q6 is electrically coupled to a second terminal of the sixth electronic switch Q6 through the tenth resistor R10, a second terminal of the sixth electronic switch Q6 is electrically coupled to the cathode of the third diode D3, and a third terminal of the sixth electronic switch Q6 is electrically coupled to the switch driving port 12.

In one embodiment, the fifth electronic switch Q5 may be NPN type triode, and the sixth electronic switch Q6 may be PNP type triode. The first terminal of the fifth electronic switch Q5 may be a base of the NPN type triode, the second terminal of the fifth electronic switch Q5 may be an emitter of the NPN type triode, and the third terminal of the fifth electronic switch Q5 may be a collector of the NPN type triode. The first terminal of the sixth electronic switch Q6 may be a base of the PNP type triode, the second terminal of the sixth electronic switch Q6 may be an emitter of the PNP type triode, and the third terminal of the sixth electronic switch Q6 may be a collector of the PNP type triode.

In at least one embodiment, the port shutdown circuit 15 includes a seventh electronic switch Q7, an eighth electronic switch Q8, an eleventh resistor R11, a twelfth resistor R12, and a thirteenth resistor R13.

A first terminal of the seventh electronic switch Q7 is electrically coupled to a fourth control pin D of the microcontroller 30 through the eleventh resistor R11, a second terminal of the seventh electronic switch Q7 is grounded, and a third terminal of the seventh electronic switch Q7 is electrically coupled to a first terminal of the electronic switch Q8 through the twelfth resistor R12. The first terminal of the eighth electronic switch Q8 is electrically coupled to a second terminal of the eighth electronic switch Q8 through the thirteenth resistor R13, the second terminal of the eighth electronic switch Q8 is electrically coupled to the third terminal of the sixth electronic switch Q6, and a third terminal of the eighth electronic switch Q8 is electrically coupled to the anode of the fourth diode D4.

In one embodiment, the seventh electronic switch Q7 may be NPN type triode, and the eighth electronic switch Q8 may be PNP type triode. The first terminal of the seventh electronic switch Q7 may be a base of the NPN type triode, the second terminal of the seventh electronic switch Q7 may be an emitter of the NPN type triode, and the third terminal of the seventh electronic switch Q7 may be a collector of the NPN type triode. The first terminal of the eighth electronic switch Q8 may be a base of the PNP type triode, the second terminal of the eighth electronic switch Q8 may be an emitter of the PNP type triode, and the third terminal of the eighth electronic switch Q8 may be a collector of the PNP type triode.

In at least one embodiment, the voltage feedback circuit 16 includes a fourteenth resistor R14, a fifteenth resistor R15, a sixteenth resistor R16, and a third capacitor C3.

A first terminal of the fourteenth resistor R14 is electrically coupled to a fifth control pin E of the microcontroller 30, the first terminal of the fourteenth resistor R14 is grounded through the third capacitor C3, a second terminal of the fourteenth resistor R14 is grounded through the fifteenth resistor R15, and the second terminal of the fourteenth resistor R14 is electrically coupled to the third terminal of the sixth electronic switch Q6 through the sixteenth resistor R16.

In at least one embodiment, the switch feedback circuit 17 includes a seventeenth resistor R17, an eighteenth resistor R18, a nineteenth resistor R19, and a fourth capacitor C4.

A first terminal of the seventeenth resistor R17 is electrically coupled to a sixth control pin F of the microcontroller 30, the first terminal of the seventeenth resistor R17 is grounded through the fourth capacitor C4, and a second terminal of the seventeenth resistor R17 is electrically coupled to a node P1 between the electronic switch module 20 and the external port 300 through the nineteenth resistor R19. The second terminal of the seventeenth resistor R17 is grounded through the eighteenth resistor R18. In one embodiment, the sixth control pin F of the microcontroller 30 may be an ADC input port.

In at least one embodiment, the drive supply circuit 18 includes a ninth electronic switch Q9, a tenth electronic switch Q10, a twenty resistor R20, a twenty-first resistor R21, a twenty-second resistor R22, and a twenty-third resistor R23.

A first terminal of the ninth electronic switch Q9 is electrically coupled to seventh control pin G of the microcontroller 30 through the twenty resistor R20, a second terminal of the ninth electronic switch Q9 is grounded, and the first terminal of the ninth electronic switch Q9 is electrically coupled to the second terminal of the ninth electronic switch Q9 through the twenty-first resistor R21. A third terminal of the ninth electronic switch Q9 is electrically coupled to a second terminal of the tenth electronic switch Q10 through the twenty-second resistor R22 and the twenty-third resistor R23, and the second terminal of the tenth electronic switch Q10 is electrically coupled to the battery positive electrode 200. A first terminal of the tenth electronic switch Q10 is electrically coupled to a node between the twenty-second resistor R22 and the twenty-third resistor R23, and a third terminal of the tenth electronic switch Q10 is electrically coupled to the anode of the second diode D2.

In one embodiment, the ninth electronic switch Q9 may be NPN type triode, and the tenth electronic switch Q10 may be PNP type triode. The first terminal of the ninth electronic switch Q9 may be a base of the NPN type triode, the second terminal of the ninth electronic switch Q9 may be an emitter of the NPN type triode, and the third terminal of the ninth electronic switch Q9 may be a collector of the NPN type triode. The first terminal of the tenth electronic switch Q10 may be a base of the PNP type triode, the second terminal of the tenth electronic switch Q10 may be an emitter of the PNP type triode, and the third terminal of the tenth electronic switch Q10 may be a collector of the PNP type triode.

In at least one embodiment, the electronic switch module 20 includes an eleventh electronic switch Q11, a twelfth electronic switch Q12, a twenty-fourth resistor R24, and a second zener diode ZD2.

A first terminal of the eleventh electronic switch Q11 is electrically coupled to the switch driving port 12, a second terminal of the eleventh electronic switch Q11 is electrically coupled to the battery positive electrode 200, and a third terminal of the eleventh electronic switch Q11 is electrically coupled to the first terminal of the eleventh electronic switch Q11 through the twenty-fourth resistor R24.

A first terminal of the twelfth electronic switch Q12 is electrically coupled to the switch driving port 12, a second terminal of the twelfth electronic switch Q12 is electrically coupled to the external port 300, and a third terminal of the twelfth electronic switch Q12 is electrically coupled to the third terminal of the electronic switch Q11. The third terminal of the twelfth electronic switch Q12 is electrically coupled to the first tee urinal of the twelfth electronic switch Q12 through the second zener diode ZD2.

In the embodiment, both the eleventh electronic switch Q11 and the twelfth electronic switch Q12 may be N-type field effect transistor (N-FET). The first terminal of the eleventh electronic switch Q11 and the twelfth electronic switch Q12 may be a gate of the N-FET, the second terminal of the electronic switch Q11 and the twelfth electronic switch Q12 may be a drain of the N-FET, and the third terminal of the eleventh electronic switch Q11 and the twelfth electronic switch Q12 may be a source of the N-FET.

Figure 4:
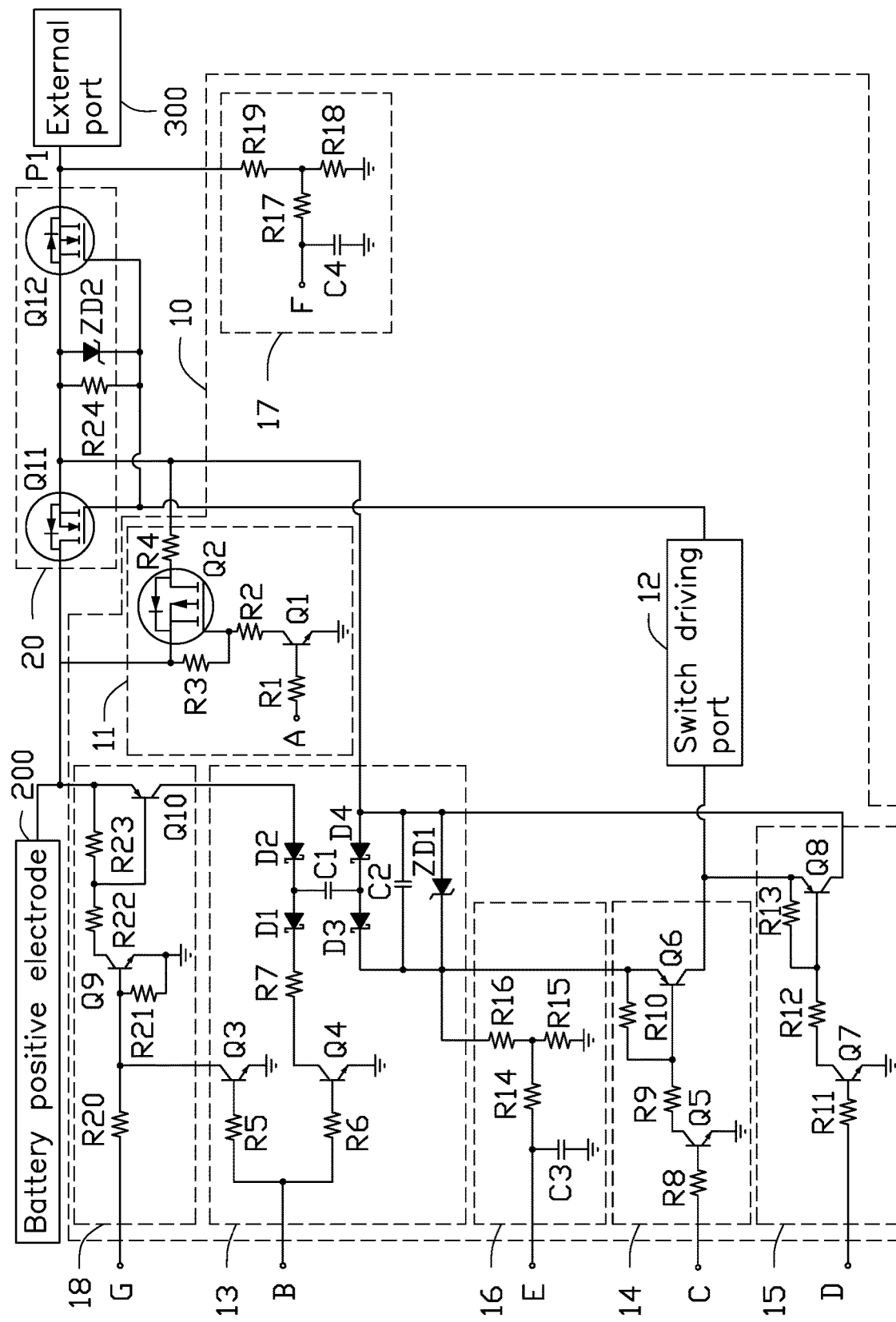
FIG. 4 is a circuit diagram of second embodiment of the battery controlling circuit of FIG. 1.

FIG. 4 illustrates a circuit diagram of the battery controlling circuit 100 in accordance with a second embodiment of the present disclosure.

The battery control circuit 100 of the present embodiment differs from the battery control circuit 100 of the first embodiment in that:

In the embodiment, the voltage feedback circuit 16 includes a fourteenth resistor R14, a fifteenth resistor R15, a sixteenth resistor R16, and a third capacitor C3.

A first terminal of the fourteenth resistor R14 is electrically coupled to the fifth control pin E of the microcontroller 30, the first terminal of the fourteenth resistor R14 is grounded through the capacitor C3, a second terminal of the fourteenth resistor R14 is grounded through the fifteenth resistor R15, and the second terminal of the resistor R14 is electrically coupled to the cathode of the zener diode ZD1 through the sixteenth resistor R16. In at least one embodiment, the fifth control pin E of the microcontroller 30 may be an ADC input port.

In use, the first control pin A of the microcontroller 30 outputs signal at high-voltage level to turn on the first electronic switch Q1, the potential of the second terminal of the second electronic switch Q2 is pulled down, and the second electronic switch Q2 is thereby turned on. Thereby, the battery positive electrode 200 outputs a supply voltage to the anode of the fourth diode D4.

In addition, the seventh control pin G of the microcontroller 30 outputs signal at high-voltage level to turn on the ninth electronic switch Q9, the potential of the first terminal of the tenth electronic switch Q10 is pulled down, and the tenth electronic switch Q10 is thereby turned on. Therefore, the battery positive electrode 200 outputs a ripple voltage to the anode of the second diode D2.

The second control pin B of the microcontroller 30 outputs a pulse width modulation (PWM) signal to turn on the third electronic switch Q3 and the fourth electronic switch Q4. The high frequency switch of the third electronic switch Q3 and the fourth electronic switch Q4 constitutes the first diode D1, the second diode D2, the third diode D3, the fourth diode D4, and the first capacitor C1 as a voltage rectification structure, to generate a higher voltage than the battery positive electrode 200. The higher voltage is stored by the second capacitor C2 under regulation by the first zener diode ZD1.

Furthermore, the third control pin C of the microcontroller 30 outputs signal at high-voltage level to turn on the fifth electronic switch Q5, the potential of the first terminal of the sixth electronic switch Q6 is pulled down, and the sixth electronic switch Q6 is thereby turned on. Meanwhile, the driving voltage stored at the two ends of the second capacitor C2 is output to the first terminal of the eleventh electronic switch Q11 and the twelfth electronic switch Q12 through the switch driving port switch driving port 12, and the eleventh electronic switch Q11 and the twelfth electronic switch Q12 are thereby turned on.

The voltage feedback circuit 16 detects the driving voltage outputted by the voltage generating circuit 13 and transmits the detected driving voltage to the microcontroller 30. The microcontroller 30 determines whether the driving voltage is greater than or equal to a first predetermined voltage (such as 12 volts). If the driving voltage is less than the first predetermined voltage, the first control pin B of the microcontroller 30 adjusts the duty cycle of the pulse width modulated signal until the driving voltage is greater than or equal to the first predetermined voltage.

The switch feedback circuit 17 detects the conductive state of the eleventh electronic switch Q11 and the twelfth electronic switch Q12, the microcontroller 30 acquires the detected voltage of the node P1 through the switch feedback circuit 17, and determines whether the detected voltage is equal to the voltage outputted by the battery positive electrode 200. If the detected voltage is equal to the voltage outputted by the battery positive electrode 200, the switch driving circuit 10 drives the electronic switch module 20, otherwise shutdown is performed.

When the electronic switch module 20 is not required to be driven, the third control pin C of the microcontroller 30 stops outputting the signal at high-voltage level to the fifth electronic switch Q5, and the fourth control pin D of the microcontroller 30 outputs the signal at high-voltage level to turn on the seventh electronic switch Q7, the potential of the first terminal of the eighth electronic switch Q8 is pulled down, and the eighth electronic switch Q8 is thereby turned on.

The switch driving port 12 being in a closed state, the second control pin B of the microcontroller 30 stops outputting the PWM signal to the third electronic switch Q3 and the fourth electronic switch Q4. The seventh control pin G of the microcontroller 30 stops outputting the signal at high-voltage level to the ninth electronic switch Q9, and the first control pin A of the microcontroller 30 stops outputting the signal at high-voltage level to the first electronic switch Q1.

In addition, the microcontroller 30 determines whether the voltage of the node P1 is equal to a second predetermined voltage (such as zero volts). If the voltage of the node P1 is equal to the second predetermined voltage, the electronic switch module 20 is turned off and ceases driving, otherwise the processing is turned off.

The switch driving circuit 10 can supply a voltage to the voltage generating circuit 13 through the discharge circuit 11, and generate the driving voltage through the voltage generating circuit 13 to switch the electronic switch module 20 connected to the switch driving port 12 on or off. Therefore, the switch driving circuit 10 and the battery controlling circuit 100 are highly expandable, the cost is low, and the drive voltage and drive capability can be flexibly adjusted.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A switch driving circuit, comprising:
a switch driving port coupling an electronic switch module; a discharge circuit for outputting a supply voltage;
a voltage generating circuit coupling the discharge circuit and the switch driving port, and boosting the supply voltage to a driving voltage according to an output signal of a microcontroller; wherein the driving voltage is configured to turn the electronic switch module on or off; and
a port conduction circuit coupling the switch driving port, and controlling the switch driving port to conduct a connection between the voltage generating circuit and the electronic switch module according to a first control signal of the microcontroller,
wherein the discharge circuit comprises a first electronic switch, a second electronic switch, a first resistor, a second resistor, a third resistor, and a fourth resistor;
wherein a first terminal of the first electronic switch is electrically coupled to a first control pin of the microcontroller through the first resistor, a second terminal of the first electronic switch is grounded, and a third terminal of the first electronic switch is electrically coupled to a first terminal of the second electronic switch through the second resistor; and
wherein the first terminal of the second electronic switch is electrically coupled to a second terminal of the second electronic switch through the third resistor, a second terminal of the second electronic switch is electrically coupled to a battery positive electrode, and a third terminal of the second electronic switch is electrically coupled to the voltage generating circuit through the fourth resistor, wherein the voltage generating circuit comprises a third electronic switch, a fourth electronic switch, a first diode, a second diode, a third diode, a fourth diode, a first capacitor, a fifth resistor, a sixth resistor, and a seventh resistor;
wherein a first terminal of the third electronic switch is electrically coupled to a second control pin of the microcontroller through the fifth resistor, a second terminal of the third electronic switch is grounded, and a third terminal of the third electronic switch is electrically coupled to the drive supply circuit;
wherein a first terminal of the fourth electronic switch is electrically coupled to the second control pin of the microcontroller through the sixth resistor, a second terminal of the fourth electronic switch is grounded, and a third terminal of the fourth electronic switch is electrically coupled to a cathode of the first diode through the seventh resistor;
wherein an anode of the first diode is electrically coupled to a cathode of the second diode, an anode of the second diode is electrically coupled to the drive supply circuit, and the cathode of the second diode is electrically coupled to an anode of the third diode through the first capacitor; and
wherein a cathode of the third diode is electrically coupled to the port conduction circuit, the anode of the third diode is electrically coupled to a cathode of the fourth diode, and an anode of the fourth diode is electrically coupled to the third terminal of the second electronic switch through the fourth resistor.

2. The switch driving circuit of claim 1, wherein the switch driving circuit further comprises a port shutdown circuit, the port shutdown circuit is electrically coupled between the switch driving port and the microcontroller, and the port shutdown circuit control the switch driving port to disconnect the connection between the voltage generating circuit and the electronic switch module according to a second control signal of the microcontroller.

3. The switch driving circuit of claim 2, wherein the switch driving circuit further comprises a voltage feedback circuit, the voltage feedback circuit is electrically coupled to the voltage generating circuit through the port conduction circuit, and the voltage feedback circuit detects the driving voltage and feeds back the driving voltage to the microcontroller.

4. The switch driving circuit of claim 3, wherein the switch driving circuit further comprises a switch feedback circuit, the switch feedback circuit is electrically coupled to the electronic switch module, and the switch feedback circuit detects state of the electronic switch module and feeds back to the microcontroller.

5. The switch driving circuit of claim 4, wherein the switch driving circuit further comprises a drive supply circuit, the drive supply circuit is electrically coupled to the voltage generating circuit, and the drive supply circuit supplies power to the voltage generating circuit.

6. The switch driving circuit of claim 1, wherein the voltage generating circuit further comprises a second capacitor and a first zener diode;
wherein a first terminal of the second capacitor is electrically coupled to the cathode of the third diode, and a second terminal of the second capacitor is electrically coupled to the anode of the fourth diode; and
wherein a cathode of the first zener diode is electrically coupled to the first terminal of the second capacitor, and an anode of the first zener diode is electrically coupled to the second terminal of the second capacitor.

7. The switch driving circuit of claim 6, wherein the port conduction circuit comprises a fifth electronic switch, a sixth electronic switch, an eighth resistor, a ninth resistor, and a tenth resistor;
wherein a first terminal of the fifth electronic switch is electrically coupled to a third control pin of the microcontroller through the eighth resistor, a second terminal of the fifth electronic switch is grounded, and a third terminal of the fifth electronic switch is electrically coupled to a first terminal of the sixth electronic switch through the ninth resistor; and
wherein the first terminal of the sixth electronic switch is electrically coupled to a second terminal of the sixth electronic switch through the tenth resistor, a second terminal of the sixth electronic switch is electrically coupled to the cathode of the third diode, a third terminal of the sixth electronic switch is electrically coupled to the switch driving port.

8. The switch driving circuit of claim 7, wherein the port shutdown circuit comprises a seventh electronic switch, an eighth electronic switch, an eleventh resistor, a twelfth resistor, and a thirteenth resistor;
wherein a first terminal of the seventh electronic switch is electrically coupled to a fourth control pin of the microcontroller through the eleventh resistor, a second terminal of the seventh electronic switch is grounded, and a third terminal of the seventh electronic switch is electrically coupled to a first terminal of the eighth electronic switch through the twelfth resistor; and
wherein the first terminal of the eighth electronic switch is electrically coupled to a second terminal of the eighth electronic switch through the thirteenth resistor, the second terminal of the eighth electronic switch is electrically coupled to the third terminal of the sixth electronic switch, and a third terminal of the eighth electronic switch is electrically coupled to the anode of the fourth diode.

9. The switch driving circuit of claim 8, wherein the voltage feedback circuit comprises a fourteenth resistor, a fifteenth resistor, a sixteenth resistor, and a third capacitor;
wherein a first terminal of the fourteenth resistor is electrically coupled to the fifth control pin of the microcontroller, the first terminal of the fourteenth resistor is grounded through the third capacitor, a second terminal of the fourteenth resistor is grounded through the fifteenth resistor, and the second terminal of the fourteenth resistor is electrically coupled to the cathode of the first zener diode through the sixteenth resistor.

10. The switch driving circuit of claim 9, wherein the switch feedback circuit comprises a seventeenth resistor, an eighteenth resistor, a nineteenth resistor, and a fourth capacitor;
wherein a first terminal of the seventeenth resistor is electrically coupled to a sixth control pin of the microcontroller, the first terminal of the seventeenth resistor is grounded through the fourth capacitor, a second terminal of the seventeenth resistor is electrically coupled to a node between the electronic switch module and an external port through the nineteenth resistor, and the second terminal of the seventeenth resistor is grounded through the eighteenth resistor.

11. The switch driving circuit of claim 10, wherein the drive supply circuit comprises a ninth electronic switch, a tenth electronic switch, a twenty resistor, a twenty-first resistor, a twenty-second resistor, and a twenty-third resistor;
wherein a first terminal of the ninth electronic switch is electrically coupled to a seventh control pin of the microcontroller through the twenty resistor, a second terminal of the ninth electronic switch is grounded, the first terminal of the ninth electronic switch is electrically coupled to the second terminal of the ninth electronic switch through the twenty-first resistor, a third terminal of the ninth electronic switch is electrically coupled to a second terminal of the tenth electronic switch through the twenty-second resistor and the twenty-third resistor; and
wherein a first terminal of the tenth electronic switch is electrically coupled to
a node
between the twenty-second resistor and the twenty-third resistor, the second terminal of the tenth electronic switch is electrically coupled to the battery positive electrode, a third terminal of the tenth electronic switch is electrically coupled to the anode of the second diode.

12. The switch driving circuit of claim 8, wherein the voltage feedback circuit comprises a fourteenth resistor, a fifteenth resistor, a sixteenth resistor, and a third capacitor;
wherein a first terminal of the fourteenth resistor is electrically coupled to the fifth control
pin of the microcontroller, the first terminal of the fourteenth resistor is grounded through the third capacitor, a second terminal of the fourteenth resistor is grounded through the fifteenth resistor, and the second terminal of the fourteenth resistor is electrically coupled to the third terminal of the sixth electronic switch through the sixteenth resistor.

13. A battery controlling circuit, comprising: an electronic switch module;
a microcontroller;
the switch driving circuit according to claim 1;
the electronic switch module coupling between a battery positive electrode and an external port to form a circuit loop, and controlling the circuit loop to be turned on or off; and
the microcontroller coupling the switch driving circuit, and outputting signal to the switch driving circuit;
the switch driving circuit coupling the electronic switch module, and turning the electronic switch module on or off according to the signal of the microcontroller;
the switch driving circuit, comprising:
a switch driving port coupling the electronic switch module; a discharge circuit for outputting a supply voltage;
a voltage generating circuit coupling the discharge circuit and the switch driving port, and boosting the supply voltage to a driving voltage according to an output signal of the microcontroller; wherein the driving voltage is configured to turn the electronic switch module on or off; and
a port conduction circuit coupling the switch driving port, and controlling the switch driving port to conduct a connection between the voltage generating circuit and the electronic switch module according to a first control signal of the microcontroller.

14. The battery controlling circuit of claim 13,
wherein the switch driving circuit further comprises a port shutdown circuit, the port shutdown circuit is electrically coupled between the switch driving port and the microcontroller, and the port shutdown circuit control the switch driving port to disconnect the connection between the voltage generating circuit and the electronic switch module according to a second control signal of the microcontroller;

wherein the switch driving circuit further comprises a voltage feedback circuit, the voltage feedback circuit is electrically coupled to the voltage generating circuit through the port conduction circuit, and the voltage feedback circuit detects the driving voltage and feeds back the driving voltage to the microcontroller;

wherein the switch driving circuit further comprises a switch feedback circuit, the switch feedback circuit is electrically coupled to the electronic switch module, and the switch feedback circuit detects state of the electronic switch module and feeds back to the microcontroller;

wherein the switch driving circuit further comprises a drive supply circuit, the drive supply circuit is electrically coupled to the voltage generating circuit, and the drive supply circuit supplies power to the voltage generating circuit;

wherein the voltage generating circuit further comprises a second capacitor and a first zener diode;

wherein a first terminal of the second capacitor is electrically coupled to the cathode of the third diode, and a second terminal of the second capacitor is electrically coupled to the anode of the fourth diode;

wherein a cathode of the first zener diode is electrically coupled to the first terminal of the second capacitor, and an anode of the first zener diode is electrically coupled to the second terminal of the second capacitor;

wherein the port conduction circuit comprises a fifth electronic switch, a sixth electronic switch, an eighth resistor, a ninth resistor, and a tenth resistor;

wherein a first terminal of the fifth electronic switch is electrically coupled to a third control pin of the microcontroller through the eighth resistor, a second terminal of the fifth electronic switch is grounded, and a third terminal of the fifth electronic switch is electrically coupled to a first terminal of the sixth electronic switch through the ninth resistor;

wherein the first terminal of the sixth electronic switch is electrically coupled to a second terminal of the sixth electronic switch through the tenth resistor, a second terminal of the sixth electronic switch is electrically coupled to the cathode of the third diode, a third terminal of the sixth electronic switch is electrically coupled to the switch driving port;

wherein the port shutdown circuit comprises a seventh electronic switch, an eighth electronic switch, an eleventh resistor, a twelfth resistor, and a thirteenth resistor;

wherein a first terminal of the seventh electronic switch is electrically coupled to a fourth control pin of the microcontroller through the eleventh resistor, a second terminal of the seventh electronic switch is grounded, and a third terminal of the seventh electronic switch is electrically coupled to a first terminal of the eighth electronic switch through the twelfth resistor;

wherein the first terminal of the eighth electronic switch is electrically coupled to a second terminal of the eighth electronic switch through the thirteenth resistor, the second terminal of the eighth electronic switch is electrically coupled to the third terminal of the sixth electronic switch, and a third terminal of the eighth electronic switch is electrically coupled to the anode of the fourth diode;

wherein the voltage feedback circuit comprises a fourteenth resistor, a fifteenth resistor, a sixteenth resistor, and a third capacitor;

wherein a first terminal of the fourteenth resistor is electrically coupled to the fifth control pin of the microcontroller, the first terminal of the fourteenth resistor is grounded through the third capacitor, a second terminal of the fourteenth resistor is grounded through the fifteenth resistor, and the second terminal of the fourteenth resistor is electrically coupled to the third terminal through the sixteenth resistor;

wherein the switch feedback circuit comprises a seventeenth resistor, an eighteenth resistor, a nineteenth resistor, and a fourth capacitor;

wherein a first terminal of the seventeenth resistor is electrically coupled to a sixth control pin of the microcontroller, the first terminal of the seventeenth resistor is grounded through the fourth capacitor, a second terminal of the seventeenth resistor is electrically coupled to a node between the electronic switch module and an external port through the nineteenth resistor, and the second terminal of the seventeenth resistor is grounded through the eighteenth resistor;

wherein the drive supply circuit comprises a ninth electronic switch, a tenth electronic switch, a twenty resistor, a twenty-first resistor, a twenty-second resistor, and a twenty-third resistor;

wherein a first terminal of the ninth electronic switch is electrically coupled to a seventh control pin of the microcontroller through the twenty resistor, a second terminal of the ninth electronic switch is grounded, the first terminal of the ninth electronic switch is electrically coupled to the second terminal of the ninth electronic switch through the twenty-first resistor, a third terminal of the ninth electronic switch is electrically coupled to a second terminal of the tenth electronic switch through the twenty-second resistor and the twenty-third resistor;

wherein a first terminal of the tenth electronic switch is electrically coupled to a node between the twenty-second resistor and the twenty-third resistor, the second terminal of the tenth electronic switch is electrically coupled to the battery positive electrode, a third terminal of the tenth electronic switch is electrically coupled to the anode of the second diode; and wherein the electronic switch module comprises an eleventh electronic switch and a twelfth electronic switch;

a first terminal of the eleventh electronic switch is electrically coupled to the switch driving port, a second terminal of the eleventh electronic switch is electrically coupled to the battery positive electrode, and a third terminal of the eleventh electronic switch is electrically coupled to the first terminal of the eleventh electronic switch through a twenty-fourth resistor; a first terminal of the twelfth electronic switch is electrically coupled to the switch driving port, a second terminal of the twelfth electronic switch is electrically coupled to the external port, a third terminal of the twelfth electronic switch is electrically coupled to the third terminal of the eleventh electronic switch, and the third terminal of the twelfth electronic switch is electrically coupled to the first terminal of the twelfth electronic switch through a first zener diode.

\* \* \* \* \*